United States Patent
Collins et al.

(10) Patent No.: US 11,675,462 B2
(45) Date of Patent: Jun. 13, 2023

(54) TOUCH SENSOR MUTUAL CHARGE CANCELLATION AND RELATED SYSTEMS, METHODS AND APPARATUSES

(71) Applicant: Atmel Corporation, Chandler, AZ (US)

(72) Inventors: Richard P. Collins, Southampton (GB); Samuel Daniel Brunet, North Boarhunt (GB); Paul Heslop, Eastleigh (GB)

(73) Assignee: Atmel Corporation, Chandler, AZ (US)

( * ) Notice: Subject to any disclaimer, the term of this patent is extended or adjusted under 35 U.S.C. 154(b) by 9 days.

(21) Appl. No.: 17/454,857

(22) Filed: Nov. 15, 2021

(65) Prior Publication Data
US 2022/0155891 A1 May 19, 2022

Related U.S. Application Data (60) Provisional application No. 63/198,877, filed on Nov. 19, 2020.

(51) Int. Cl.
*G06F 3/044* (2006.01)
*G01R 27/26* (2006.01)
*G06F 3/041* (2006.01)

(52) U.S. Cl.
CPC ......... *G06F 3/044* (2013.01); *G01R 27/2605* (2013.01); *G06F 3/0412* (2013.01); *G06F 3/0416* (2013.01)

(58) Field of Classification Search
None
See application file for complete search history.

(56) References Cited

U.S. PATENT DOCUMENTS

| | | | | |
|---|---|---|---|---|
| 8,610,443 B1* | 12/2013 | Ryshtun | .............. | G06F 3/03545 324/683 |
| 8,874,396 B1* | 10/2014 | Olson | ................. | G06F 3/03545 345/173 |
| 2009/0153152 A1 | 6/2009 | Maharyta et al. | | |
| 2013/0234737 A1 | 9/2013 | Chang | | |
| 2014/0368459 A1 | 12/2014 | Lei | | |
| 2017/0061188 A1 | 3/2017 | Kremin et al. | | |
| 2020/0192520 A1 | 6/2020 | Guedon et al. | | |

FOREIGN PATENT DOCUMENTS

WO   2013/061550 A1   5/2013

OTHER PUBLICATIONS

International Search Report from International Application No. PCT/US2021/072399, dated Feb. 3, 2022, 5 pages.
International Written Opinion from International Application No. PCT/US2021/072399, dated Feb. 3, 2022, 8 pages.

* cited by examiner

*Primary Examiner* — Stephen T. Reed
(74) *Attorney, Agent, or Firm* — TraskBritt (57) ABSTRACT

A process includes receiving an associated input signal via a receiver electrode of a sensor array, the associated input signal indicative of an associated mutual capacitance of the receiver electrode; adding a balancing signal to the associated input signal to generate a balanced input signal at least partially responsive to a number of sensor nodes at the receiver electrode; generating a voltage signal indicative of the associated mutual capacitance of the receiver electrode at least partially responsive to a balanced input signal; and generating a digital value representative of the voltage signal.

17 Claims, 9 Drawing Sheets

TOUCH SENSOR MUTUAL CHARGE CANCELLATION AND RELATED SYSTEMS, METHODS AND APPARATUSES

CROSS-REFERENCE TO RELATED APPLICATION

This patent application claims priority to U.S. Provisional Patent Application No. 63/198,877, filed Nov. 19, 2020, and titled FREE-FORM TOUCH SENSOR MUTUAL CHARGE CANCELLATION, the entire disclosure of which is hereby incorporated herein by this reference.

FIELD

The present disclosure relates generally to capacitive sensors and mutual capacitive touch sensing.

BACKGROUND

Capacitive sensors are utilized in a variety of operational contexts, such as touch screens, touch pads, and capacitive buttons, without limitation.

BRIEF DESCRIPTION OF THE DRAWINGS

To easily identify the discussion of any particular element or act, the most significant digit or digits in a reference number refer to the figure number in which that element is first introduced.

DETAILED DESCRIPTION

In the following detailed description, reference is made to the accompanying drawings, which form a part hereof, and in which are shown, by way of illustration, specific examples of examples in which the present disclosure may be practiced. These examples are described in sufficient detail to enable a person of ordinary skill in the art to practice the present disclosure. However, other examples enabled herein may be utilized, and structural, material, and process changes may be made without departing from the scope of the disclosure.

The illustrations presented herein are not meant to be actual views of any particular method, system, device, or structure, but are merely idealized representations that are employed to describe the examples of the present disclosure.

In some instances, similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed examples. The use of the terms "exemplary," "by example," and "for example," means that the related description is explanatory, and though the scope of the disclosure is intended to encompass the examples and legal equivalents, the use of such terms is not intended to limit the scope of an example or this disclosure to the specified components, steps, features, functions, or the like.

It will be readily understood that the components of the examples as generally described herein and illustrated in the drawings could be arranged and designed in a wide variety of different configurations. Thus, the following description of various examples is not intended to limit the scope of the present disclosure, but is merely representative of various examples. While the various aspects of the examples may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art would understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the examples disclosed herein may be implemented or performed with a general purpose processor, a special purpose processor, a digital signal processor (DSP), an integrated circuit (IC), an Application Specific integrated circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to examples of the present disclosure.

The examples may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may comprise one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

In this description, the term "coupled" and derivatives thereof may be used to indicate that two elements co-operate or interact with each other. When an element is described as being "coupled" to another element, then the elements may be in direct physical or electrical contact or there may be intervening elements or layers present. In contrast, when an element is described as being "directly coupled" to another element, then there are no intervening elements or layers present. The terms "on" and "connected" may be used in this description interchangeably with the term "coupled," and have the same meaning unless expressly indicated otherwise or the context would indicate otherwise to a person having ordinary skill in the art.

Mutual capacitance is the capacitive coupling between objects, and in the case of touch sensors, the capacitive coupling between intersections of electrodes serving as transmitters (transmitter electrodes) and electrodes serving as receivers (receiver electrodes), also sometimes referred to as "X electrodes" and "Y electrodes," respectively. In a typical arrangement for mutual capacitance sensing, the transmitter electrodes and receiver electrodes are respectively arranged in a grid of rows and columns, and intersections of the transmitter and receiver electrodes each referred to as a "sensor node." The transmitter electrodes are driven with pulses that inject current into the receiver electrode's capacitance via mutual capacitance ($C_M$) coupling between the transmitter and receiver electrodes. A grounded object in suitable proximity to a sensor node shunts away some of the charge via a capacitively coupled ground path, and so appears to an observer (i.e., a measurement circuit) to change (e.g., decrease) the mutual capacitance between the transmitter and receiver electrodes intersecting at that sensor node. Mutual capacitance sensing involves detecting such changes in mutual capacitance.

A typical two-dimensional (2D) arrangement of a sensor array for mutual capacitance sensing has a rectangular shape, and a typical touch controller is pre-configured to detect changes in capacitive load at a sensor array having a rectangular shape. Sometimes multiple arrangements that respectively have a rectangular shape are combined, and individually coupled to multiple touch controllers pre-configured to detect changes in capacitive load at sensor array having a rectangular shape. In a rectangular arrangement of a sensor array, each row (and column) of the sensor array typically has the same number of sensor nodes. The number of sensor nodes per row can be the same or different than the number of sensor nodes per column. Such symmetry is convenient for mutual capacitance sensing because the effects of capacitive loads on the sensor array is balanced (i.e., equalized) and so by utilizing differential signal processing of adjacent lines such capacitive loads do not limit the operating gain range of a touch controller.

Sometimes it may be desirable to have a sensor array of, e.g., a touch screen or touch pad, without limitation, in an arrangement that has a non-rectangular shape (e.g., trapezoidal or elliptical, and regular or irregular shaped, without limitation). For a non-rectangular arrangement of a sensor array, some rows (or columns) of the sensor array may have a different number of sensor nodes than other rows (or columns) of the sensor array, and the inventors of this application appreciate that for certain types of capacitive loads (e.g., connector-to-connector capacitance or mutual capacitance, without limitation) the effects on a touch sensing measurement are different based on the number of sensor nodes, and the use of differential signal processing of adjacent lines is limited in certain areas.

The inventors of this disclosure appreciate that would be advantageous to adjust an associated input signal to a measurement circuit or capacitance-to-voltage converter thereof such that the adjusted associated input signal corresponds (e.g., in terms of magnitude or frequency, without limitation) to an input signal expected if each row (or column) of a sensor array had a same number of sensor nodes (as in the case of a rectangular-shaped sensor array), in other words, to reduce at least some charge imbalances due to capacitance imbalances. Stated another way, change an input signal to be more like an input signal associated with a balanced layout.

One or more examples relate, generally, to an apparatus (e.g., a touch controller, without limitation) that includes a connector, a capacitance-to-voltage converter, a signal balancing circuit, and an analog-to-digital converter. The connector may be operable to be coupled to a receiver electrode of a sensor array. The capacitance-to-voltage converter may be coupled with the connector to generate a voltage signal indicative of an associated mutual capacitance of the receiver electrode. The signal balancing circuit may be coupled to an input path of the capacitance-to-voltage converter to add a balancing signal to an associated input signal to generate a balanced input signal provided to the capacitance-to-voltage converter to generate the voltage signal, the balanced input signal in-phase, or out of phase, with the associated input signal. The analog-to-digital converter may be coupled with the capacitance-to-voltage converter to generate a digital value representative of the generated voltage signal.

Figure 1:
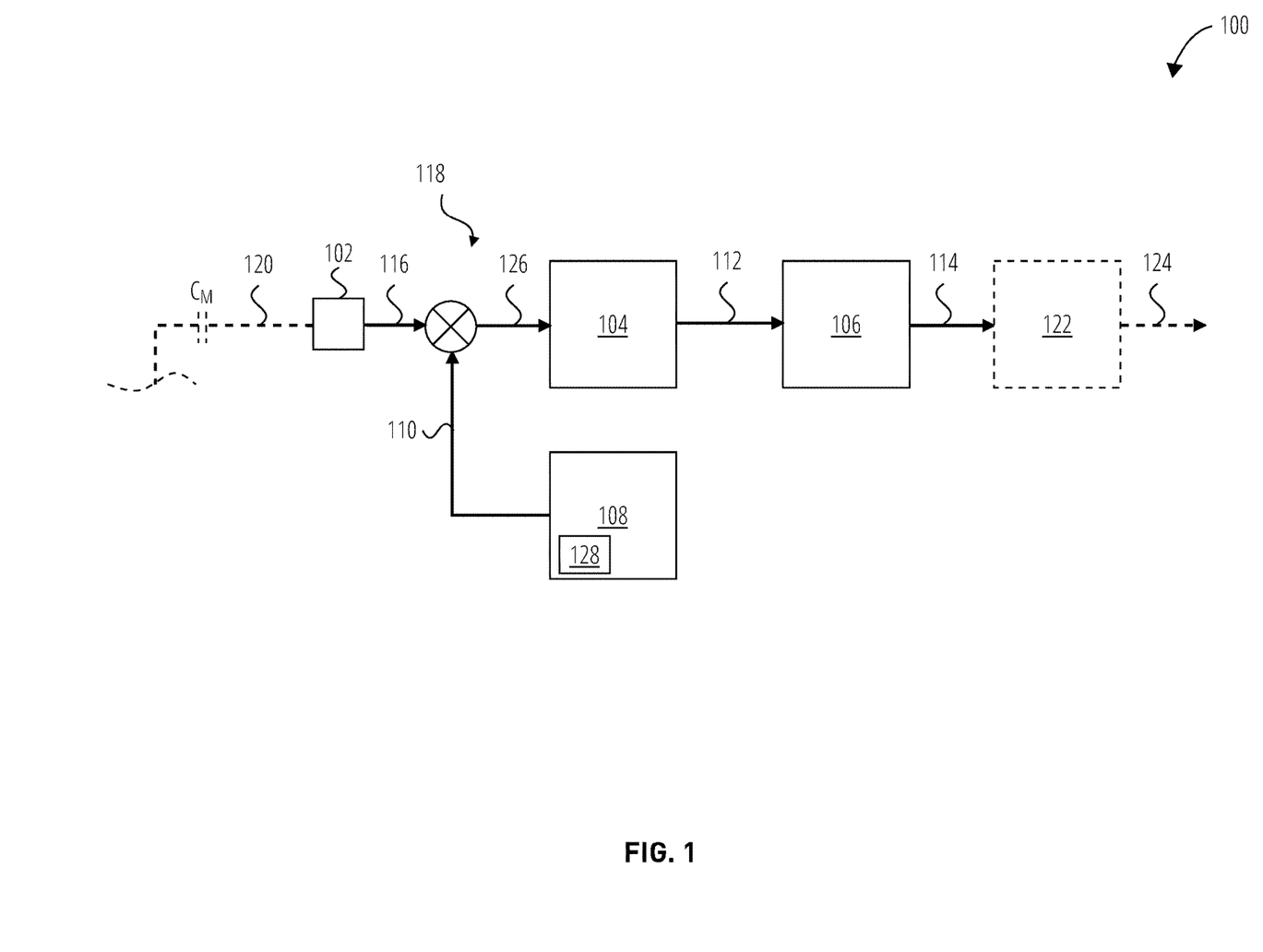
FIG. 1 is a schematic diagram depicting an apparatus in accordance with one or more examples.

FIG. 1 is a schematic diagram depicting an apparatus 100 in accordance with one or more examples. Apparatus 100 may include a connector 102, a capacitance-to-voltage converter 104, an analog-to-digital converter 106, a signal-balancing circuit 108, and an optional logic circuit 122.

Connector 102 may be operable to couple with optional receiver electrode 120 of a sensor array (sensor array not depicted). Receiver electrode 120 may have multiple associated sensor nodes, but for convenience, a single sensor node is depicted. The sensor node has an associated mutual capacitance $C_M$ (also referred to as an "associated mutual capacitance $C_M$ of receiver electrode 120"). Connector 102 may be any suitable structure for providing electrical contact (e.g., with a matching structure of, as a non-limiting example, a sensor array) such as a pin or pad, without limitation.

Capacitance-to-voltage converter 104 is coupled with connector 102 to generate a voltage signal 112 indicative of the associated mutual capacitance $C_M$ of receiver electrode 120 at least partially based on an associated input signal 126.

In one or more examples, capacitance-to-voltage converter 104 may include circuits and logic to generate a voltage signal 112 indicative of an associated mutual capacitance $C_M$ according to any suitable technique. A non-limiting example of a suitable technique is utilization of a relaxation oscillator that oscillates with a frequency indicative of an associated mutual capacitance. Another non-limiting example of a suitable technique is utilization of a circuit that tracks the time to charge a capacitance of a sensor node to a predetermined voltage or an amount a sensor node is charged over a predetermined period of time—time to charge or amount charged being indicative of mutual capacitance. Another non-limiting example of a suitable technique is utilization of a capacitive voltage divider circuit, where, if the sensor node and connector (e.g., connector 102, without limitation) are respectively charged to predetermined voltages and then share charge, the resultant voltage at an associated capacitor is indicative of a change in capacitance at the sensor node. Another non-limiting example of a suitable technique is utilization of a charge transfer circuit that accumulates charge onto an integrating capacitor and the voltage across the integrating capacitor, which is indicative of mutual capacitance, is compared to a reference voltage or read by an analog-to-digital converter for comparison to a threshold value. Another non-limiting example of a suitable technique is utilization of sigma-delta modulation where a voltage across an external capacitor is modulated about a reference voltage in charge-up and charge-down operations and the time duration of these operations is indicative of mutual capacitance.

Signal-balancing circuit 108 is coupled to input path 118 of capacitance-to-voltage converter 104 to add a balancing signal 110 to an associated input signal 116 received via connector 102 and receiver electrode 120. The associated input signal 116, added with the balancing signal 110, is utilized by the capacitance-to-voltage converter 104 to generate the voltage signal 112 indicative of the associated mutual capacitance $C_M$ of receiver electrode 120.

An amount and phase of balancing signal 110 added to associated input signal 116 may be proportional to a number of sensor nodes present along receiver electrode 120. In one or more examples, signal-balancing circuit 108 may generate balancing signal 110 at least partially responsive to a setting 128 representative of a number of sensor nodes present at the receiver electrode. In a case where more sensor nodes are present than an equivalent balanced layout (additional sensor nodes), balancing signal 110 may be out-of-phase with associated input signal 116 (i.e., subtractive/destructive) and a magnitude of balancing signal 110 may be proportional to the number of additional sensor nodes that are present—and a predetermined value of setting 128 preset at balancing circuit 108 may reflect such phase offset and magnitude. In a case where fewer sensor nodes are present than an equivalent balanced layout (missing sensor node), balancing signal 110 may be in-phase with associated input signal 116 (i.e., additive/constructive) and a magnitude of balancing signal 110 may be proportional to the number of missing sensor nodes—and a predetermined value of setting 128 preset at signal-balancing circuit 108 may reflect such phase offset (in this case no phase offset or generally in phase) and magnitude.

In one or more examples, an equivalent balanced layout or number of sensor nodes thereof may be known or predetermined and utilized to determine a number of additional sensor nodes, or a number of missing sensor nodes. As a non-limiting example, a value for setting 128 may be preset at a touch controller including signal-balancing circuit 108 for a sensor array arrangement having a pre-determined shape. As a non-limiting example, a value for setting 128 may be preset at a touch controller including signal-balancing circuit 108 for a sensor array arrangement being integrated with such a touch controller. As a non-limiting example, respective values for multiple setting 128 ("settings 128") may be preset at a touch controller including signal balancing circuit 108 for multiple sensor array arrangements, and respective ones of settings 128 may be selectable (or alternatively selectable) for respective ones of multiple sensor array arrangements optionally integrated with such a touch controller that includes apparatus 100.

In one or more examples, a value of setting 128 may be indicative of a predetermined magnitude and phase expected to reduce at least some charge imbalance at the input path 118 due to capacitance imbalances due, for example, to non-rectangular arrangements of sensor arrays.

Analog-to-digital converter 106 is coupled to capacitance-to-voltage converter 104 to generate digital value 114 representative of a magnitude of voltage signal 112, and accordingly, indicative of an associated mutual capacitance of receiver electrode 120.

A mutual capacitance $C_M$ of receiver electrode 120 may change, and so observed mutual capacitance $C_M$ of receiver electrode 120 may change and digital values 114 indicative of mutual capacitance $C_M$ of receiver electrode 120 may change. Optional logic circuit 122 is coupled to analog-to-digital converter 106 to detect a change in associated mutual capacitance $C_M$ of the receiver electrode 120 at least partially responsive to generated digital value 114, and generate an indication 124 thereof. As a non-limiting example, logic circuit 122 may include or have access to a memory that stores a threshold value for mutual capacitance $C_M$ (e.g., a baseline value corresponding to no object in proximity of a sensor array that includes receiver electrode 120, without limitation) and logic to compare digital value 114 to the threshold value (e.g., a comparator or threshold detector, without limitation).

In one or more examples, differential signal processing—e.g., where a differential signal constructed from component signals of adjacent sensor electrodes (transmitter or receiver) are measured to determine values indicative of mutual capacitance—is utilized in mutual touch sensing. As non-limiting examples, differential signals may be utilized for mutual touch sensing with touch displays to reduce the impact of display noise or to support higher signal path gain.

If the number of sensor nodes of adjacent sensor electrodes differs, then the effects of some capacitive loads on the touch sensing measurement may be correspondingly different. Undesirable aspects of such affects may be increased in the case where differential signal processing is utilized, for example, because sensor signals do not cancel and signal path gain is reduced.

One or more examples relate, generally, to adding a balancing signal to an associated input signal utilized to generate a differential signal. The added balancing signal is to compensate for different number of sensor nodes along various receiver electrodes of a sensor array and improve differential signal processing more generally.

Figure 2:
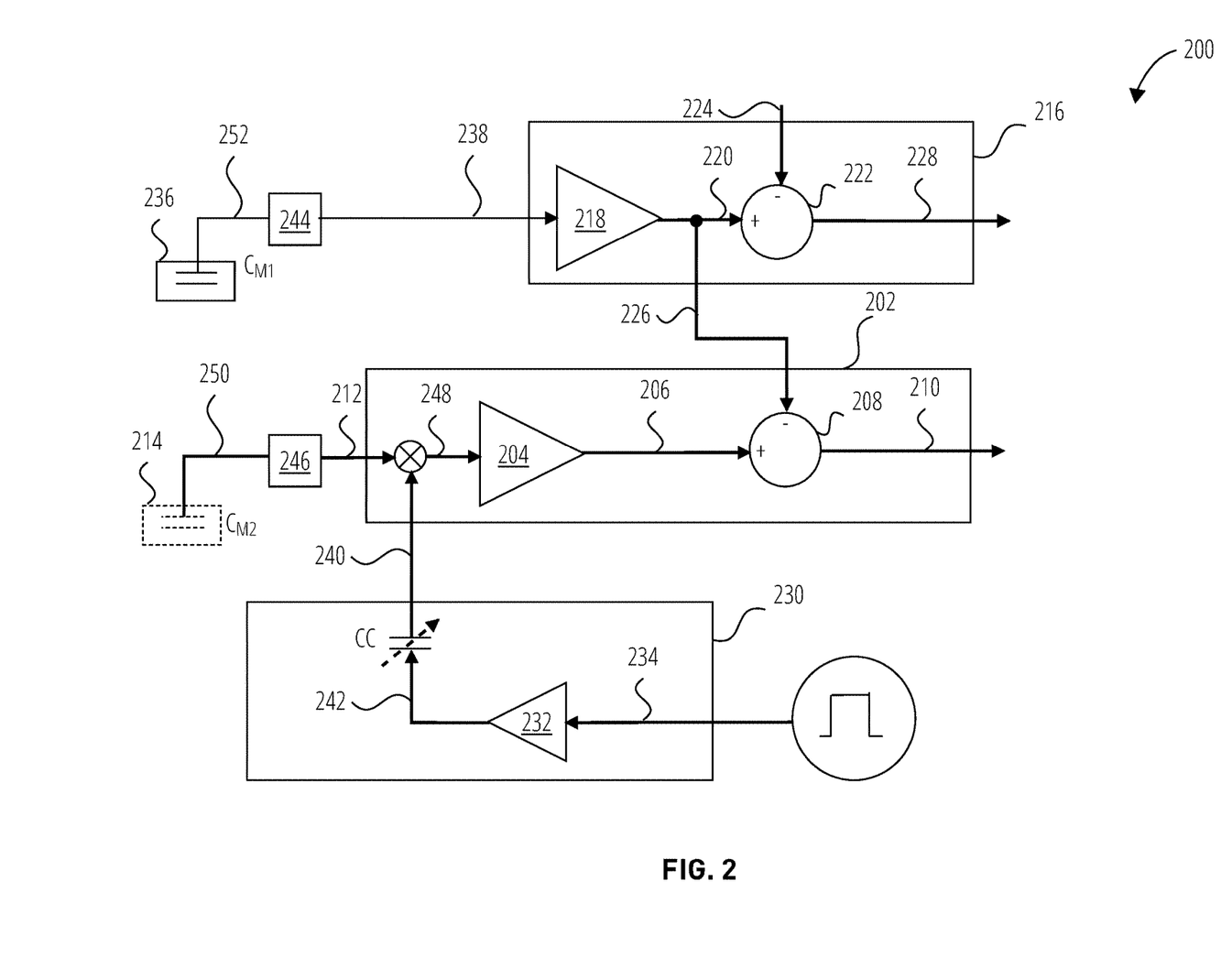
FIG. 2 is a schematic diagram depicting a portion of a touch sensing apparatus that utilizes differential signal processing, in accordance with one or more examples.

FIG. 2 is a schematic diagram depicting a portion 200 of a touch sensing apparatus that utilizes differential signal processing, in accordance with one more examples. Portion 200 includes an input path 202, an adjacent input path 216 and a charge injection circuit 230. Input path 202 includes current amplifier 204 and summation block 208. Adjacent input path 216 includes current amplifier 218 and summation block 222. Charge injection circuit 230 includes voltage driver 232 and charge compensation capacitor denoted "CC" in FIG. 2.

In the specific non-limiting arrangement depicted by FIG. 2, input path 202 is coupled to receiver electrode 250 associated with a missing sensor node (such missing sensor node denoted "missing sensor node 214" for convenience in this description, which is not intended to imply that a placeholder sensor node or inactive sensor node is required by this disclosure) by connector 246. Adjacent input path 216 is coupled to receiver electrode 252 associated with sensor node 236 by connector 244. Sensor node 236 is present at a sensor array (not depicted) that includes receiver electrode 252, also characterized herein as "not missing."

At adjacent input path 216, current amplifier 218 to amplify associated input signal 238 (associated with receiver electrode 252), received via coupled connector 244, to generate component input signal 220. Component input signal 220 and adjacent component input signal 224 (e.g., sourced from an adjacent sensor electrode that is not shown) are provided to positive and negative input terminals, respectively, of summation block 222, to generate differential associated input signal 228. At input path 202, current amplifier 204 to amplify associated input signal 212 (associated with receiver electrode 250), received via coupled connector 246, to generate component input signal 206. Component input signal 206 and adjacent component input signal 226 are provided to positive and negative input terminals, respectively, of summation block 208 to generate differential associated input signal 210. In one or more examples, differential associated input signal 210 and differential associated input signal 228 may be utilized to detect mutual capacitance at a sensor array including receiver electrodes 252 and 252.

Depictions by FIG. 2 of locally generated component input signals (e.g., component input signal 220 and component input signal 206) being provided to positive input terminals of respective summation blocks 208, 222 and remotely generated component input signals (e.g., adjacent component input signal 224 and adjacent component input signal 226) being provided to respective negative input terminals of summation blocks 208, 222, is merely for descriptive convenience, and does not limit this disclosure in anyway, and other arrangements are specifically contemplated.

Charge injection circuit 230 is coupled to a node at an input of current amplifier 204 to add charge transfer 240 to associated input signal 212 (which exhibits a difference from an equivalent balanced layout due to the missing sensor node 214) to generate balanced input signal 248. At charge injection circuit 230, voltage driver 232 to generate a driving voltage 242 in response to event signal 234 and apply it to compensation capacitor CC. A first plate of charge compensation capacitor CC is coupled to the output of voltage driver 232 and a second plate of charge compensation capacitor CC is coupled to a node that is coupled to an input of current amplifier 204 and further coupled to connector 246. Compensation capacitor CC is to inject charge (in or out of phase) to the input of current amplifier 204 in response to the application of driving voltage 242 to the second plate of compensation capacitor CC thereby adding charge transfer 240 to associated input signal 212. Accordingly, charge transfer 240 addresses differences in charges respectively associated with input signal 212 and input signal 238. As a non-limiting example, this difference could be influenced, at least in part, by differences in capacitive coupling to connectors 244 and 246.

In one or more examples, charge compensation capacitor CC is optionally programmable to tune to a fixed voltage output by voltage driver 232. A magnitude of the balancing signal generated via charge transfer 240 may be tuned by: changing a size (magnitude of capacitance) of compensation capacitor CC, changing a driver voltage swing of driving voltage 242, or both changing a size of compensation capacitor CC and changing a driver voltage swing of driving voltage 242.

Figure 3:
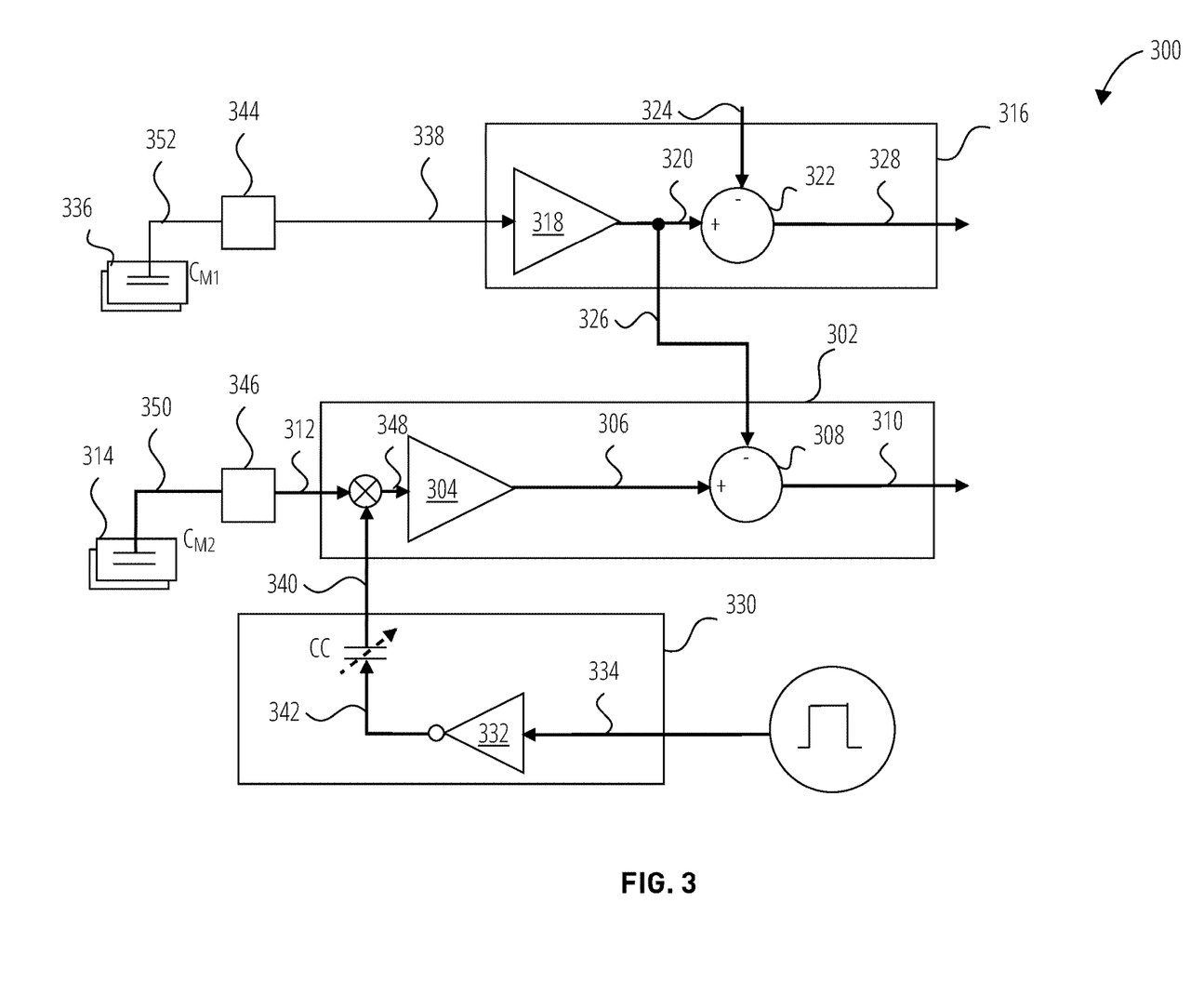
FIG. 3 is a schematic diagram depicting a portion of a touch sensing apparatus that utilizes differential signal processing, in accordance with one or more examples.

FIG. 3 is a schematic diagram depicting a portion 300 of a touch sensing apparatus that utilizes differential signal processing, in accordance with one more examples. Portion 300 includes an input path 302, an adjacent input path 316 and a charge injection circuit 330. Input path 302 includes current amplifier 304 and summation block 308. Adjacent input path 316 includes current amplifier 318 and summation block 322. Charge injection circuit 330 includes voltage driver 332 and compensation capacitor denoted CC in FIG. 3.

In one or more examples, the number of sensor nodes 336 present at receiver electrode 352 is different than the number of sensor nodes 314 present at receiver electrode 350. In the specific non-limiting arrangement depicted by FIG. 3, input path 302 is coupled to a receiver electrode 350 which has a greater number of sensor nodes present (sensor nodes 314) than a number of sensor nodes (sensor nodes 336) present at a receiver electrode 352 coupled to adjacent input path 316. In a specific non-limiting example, an equivalent balanced layout corresponds to the number of sensor nodes present at the receiver electrode coupled to input path 316.

Charge injection circuit 330 is coupled to a node at an input of current amplifier 304 to add charge transfer 340 to associated input signal 312 to cancel the effect of additional ones (as compared to an equivalent balanced layout) of sensor nodes 314 on associated input signal 312 to generate balanced input signal 348. More specifically, voltage driver 332 generates driving voltage 342 which exhibits a polarity that is the inverse of (i.e., out of phase with) event signal 334. In one or more examples, the polarity of event signal 334 may be selected (selection not shown) to match the polarity exhibited by a transmitter signal driven at a transmitter electrode of sensor node 314, such that charge transfer 340 is out of phase with associated input signal 312, which associated input signal 312 is substantially in-phase with such a transmitter signal and generated at least partially responsive thereto.

In one or more examples, respective numbers of sensor nodes (e.g., sensor nodes 336 and 314, without limitation) may both be different than the number of sensor nodes in an equivalent balanced layout and one or more charge injection circuits (e.g., charge injection circuits 330, without limitation) may induce charge transfer to input paths (e.g., input paths 316 and 302, without limitation) to balance associated input signals (e.g., input signals 338 and 312 received via connectors 344 and 346, respectively, without limitation). In such examples, respective amounts of induced charge transfer at input paths may be the same or different.

At adjacent input path 316, current amplifier 318 amplifies associated input signal 338 to generate component input signal 320. Component input signal 320 and adjacent component input signal 324 are provided to positive and negative input terminals, respectively, of summation block 322, to generate differential associated input signal 328. At input path 302, current amplifier 304 amplifies balanced input signal 348 to generate component input signal 306, and component input signal 306 and adjacent component input signal 326 (which comprises component input signal 320) are provided to positive and negative terminals, respectively, of summation block 308 to generate differential input signal 310.

In a single-ended processing example, it is desirable for respective connector-to-connector capacitances between various adjacent connectors to substantially match. Differences in the number of sensor nodes along receiver electrodes may result in different connector-to-connector capacitances.

Figure 4:
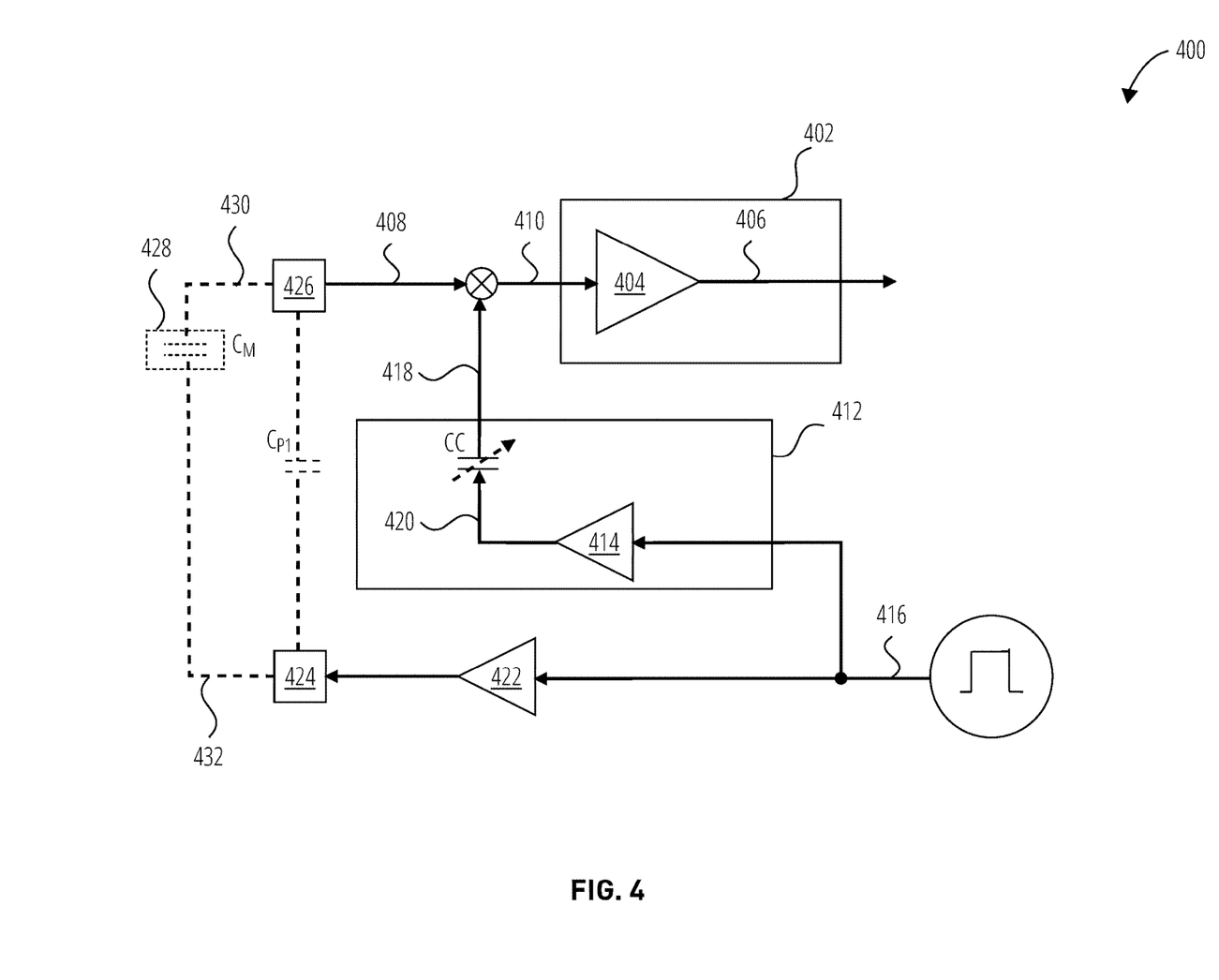
FIG. 4 is a schematic diagram depicting a portion of a touch sensing apparatus that utilizes differential signal processing, in accordance with one or more examples.

FIG. 4 is a schematic diagram depicting a portion 400 of a touch sensing apparatus that utilizes single ended signal processing, in accordance with one more examples. Portion 400 includes an input path 402 coupled to a receiver connector 426, a charge injection circuit 412 coupled to a node between input path 402 and receiver connector 426, and a voltage driver 422 coupled to adjacent transmitter connector 424 (i.e., transmitter connector 424 is arranged adjacent to receiver connector 426). Charge injection circuit 412 includes voltage driver 414 and compensation capacitor CC. Input path 402 includes amplifier 404. A mutual capacitance of sensor node 428 formed by the intersection of receiver electrode 430 (coupled to receiver connector 426) and driver electrode 432 (coupled to transmitter connector 424) is represented by mutual capacitance $C_M$. Connector-to-connector capacitance between receiver connector 426 and transmitter connector 424 is represented by connector-to-connector capacitance $C_{P1}$.

In the specific non-limiting arrangement depicted by FIG. 4, input path 402 is an input path to a touch sensing system that utilizes single-ended signal processing, as compared to FIG. 2 and FIG. 3 where the touch sensing system utilized differential signal processing. In a contemplated operation, voltage driver 414 generates and applies a voltage signal 420 to a first plate of compensation capacitor CC at least partially responsive to event 416 (e.g., generated by a clock source or event logic, without limitation). A second plate of compensation capacitor CC is coupled to receiver connector 426, and a charge transfer 418 is added to associated input signal 408 responsive to the voltage signal 420 applied to charge compensation capacitor CC to generate balanced input signal 410. Amplifier 404 amplifies balanced input signal 410 to generate input signal 406. In various examples, addition of charge transfer 418 is to compensate for difference between connector-to-connector capacitance $C_{P1}$ and other connector-to-connector capacitances (or connector-to-connector capacitances in an equivalent balanced layout) and thereby improve single ended operation.

Figure 5:
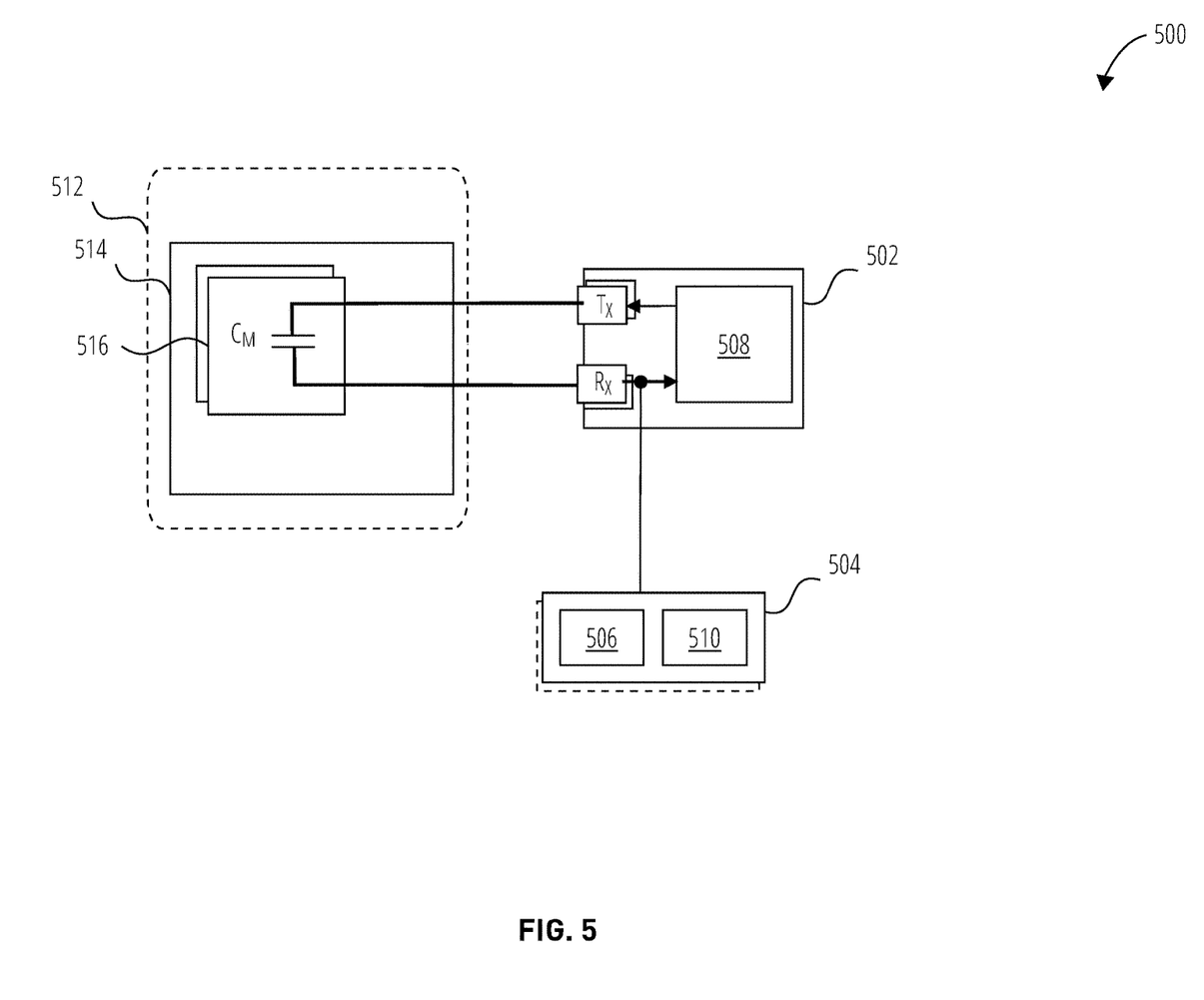
FIG. 5 is a diagram depicting a system for mutual touch sensing, in accordance with one or more examples.

FIG. 5 is a diagram depicting a system 500 for mutual touch sensing at a touch display, in accordance with one or more examples. System 500 may include measurement circuit 502, signal balancing circuit 504, and optional display 512. An arrangement 514 of receiver and transmitter electrodes is to overlay display 512. Various intersections of receiver electrodes and transmitter electrodes of arrangement 514 respectively form sensor nodes. Sensor nodes 516 are coupled to measurement circuit 502 via transmitter electrodes coupled to transmitter connectors denoted Tx, and receiver electrodes coupled to receiver connectors denoted $R_X$. In various examples, a measurement logic 508 of measurement circuit 502 may perform single-ended or differential signal processing for mutual touch sensing as discussed herein, and more specifically, measure the mutual capacitance $C_M$ of respective sensor nodes 516. Signal balancing circuit 504 is coupled with an input path of measurement logic 508 of one or more receiver electrodes $R_X$ of sensor nodes 516 to provide balancing signal(s) as discussed herein. Signal balancing circuit 504 includes settings 510 respectively settable or preset with values indicative of magnitudes and phases of balancing signals to generate, and signal generation logic 506 to generate balancing signals responsive to values of settings 510. Values of respective settings 510 may be at least partially based on respective numbers of sensor nodes 516 associated with receiver electrodes coupled to receiver connectors $R_X$. In various examples, respective settings 510 and preset values thereof may be associated with respective receiver connectors $R_X$ or receiver electrodes coupled thereto. In one or more examples, configuring values of settings 510 may involve configuring a compensation capacitor such as the compensation capacitor CC of FIG. 3 and FIG. 4, without limitation, to generate a desired balancing signal.

Notably, while not depicted, a shape exhibited by arrangement 514 may be non-rectangular, such as trapezoidal, tapered, polygonal, or elliptical, without limitation. Notably, a system 500 may be utilized for mutual touch sensing at a touch display where the arrangement 514 is rectangular, as a non-limiting example, by configuring settings 510 with values indicative of no compensation for charge imbalances.

Figure 6:
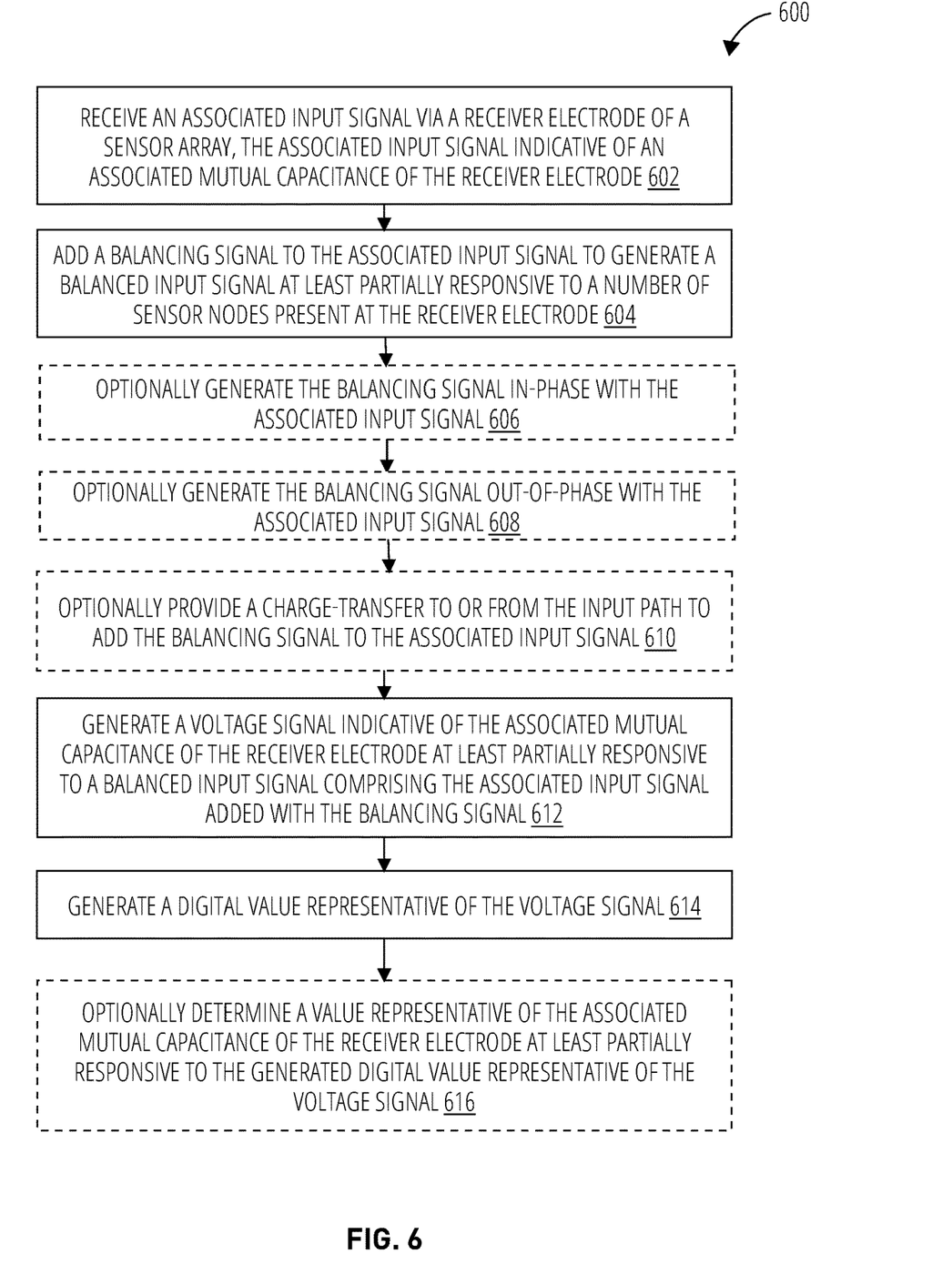
FIG. 6 is a flow diagram depicting a process, in accordance with one or more examples.

FIG. 6 is a flow diagram depicting a process 600, in accordance with one or more examples.

In operation 602, process 600 receive an associated input signal via a receiver electrode of a sensor array, the associated input signal indicative of an associated mutual capacitance of the receiver electrode.

In operation 604, process 600 add a balancing signal to the associated input signal to generate a balanced input signal at least partially responsive to a number of sensor nodes present at the receiver electrode. In one or more examples, balancing signal may be generated having a phase and magnitude that is at least partially responsive to the number of sensor nodes present at the receiver electrode or a setting (value) representative thereof. In one or more examples, the magnitude of the balancing signal may be set at a charge compensation capacitor programmed to generate an amount of charge responsive to a fixed voltage generated by an associated driver (e.g., charge compensation capacitors CC and voltage driver 232, 332, or 414 of FIG. 2, FIG. 3, or FIG. 4, without limitation). As a non-limiting example, compensation capacitor CC is a programmable capacitor array that is controlled by a digital value, which digital value may be preset.

In optional operation 606, process 600 generates the balancing signal in-phase with the associated input signal. Such an in-phase balancing signal being constructive with the associated input signal to compensate for missing sensor nodes relative to an equivalent balanced layout.

In optional operation 608, process 600 generates the balancing signal out-of-phase with the associated input signal. Such an out-of-phase balancing signal being destructive with the associated input signal to compensate for additional sensor nodes relative to an equivalent balanced layout.

In optional operation 610, process 600 provides a charge-transfer to or from the input path to add the balancing signal to the associated input signal. A charge-transfer to the input path may be understood to be constructive, and a charge-transfer from the input path may be understood to be destructive. If sensor nodes are missing in a mutual touch sensing system then typically less charge is transferred from transmitter to receiver electrode, so the balancing adds charge (in phase). If there are extra nodes or extra mutual capacitive coupling (as compared to balanced layout) then the balancing signal reduces charge (out of phase).

Notably, operation 610 may be understood as the result of operations 606 or 608, namely, by generating the in-phase or out-of-phase balancing signal that is applied to the input path a charge-transfer is provided.

In operation 612, process 600 generates a voltage signal indicative of the associated mutual capacitance of the receiver electrode at least partially responsive to a balanced input signal comprising the associated input signal added with the balancing signal.

In operation 614, process 600 generates a digital value representative of the voltage signal.

In optional operation 616, process 600 determine a value representative of the associated mutual capacitance of the receiver electrode at least partially responsive to the generated digital value representative of the voltage signal.

Figure 7:
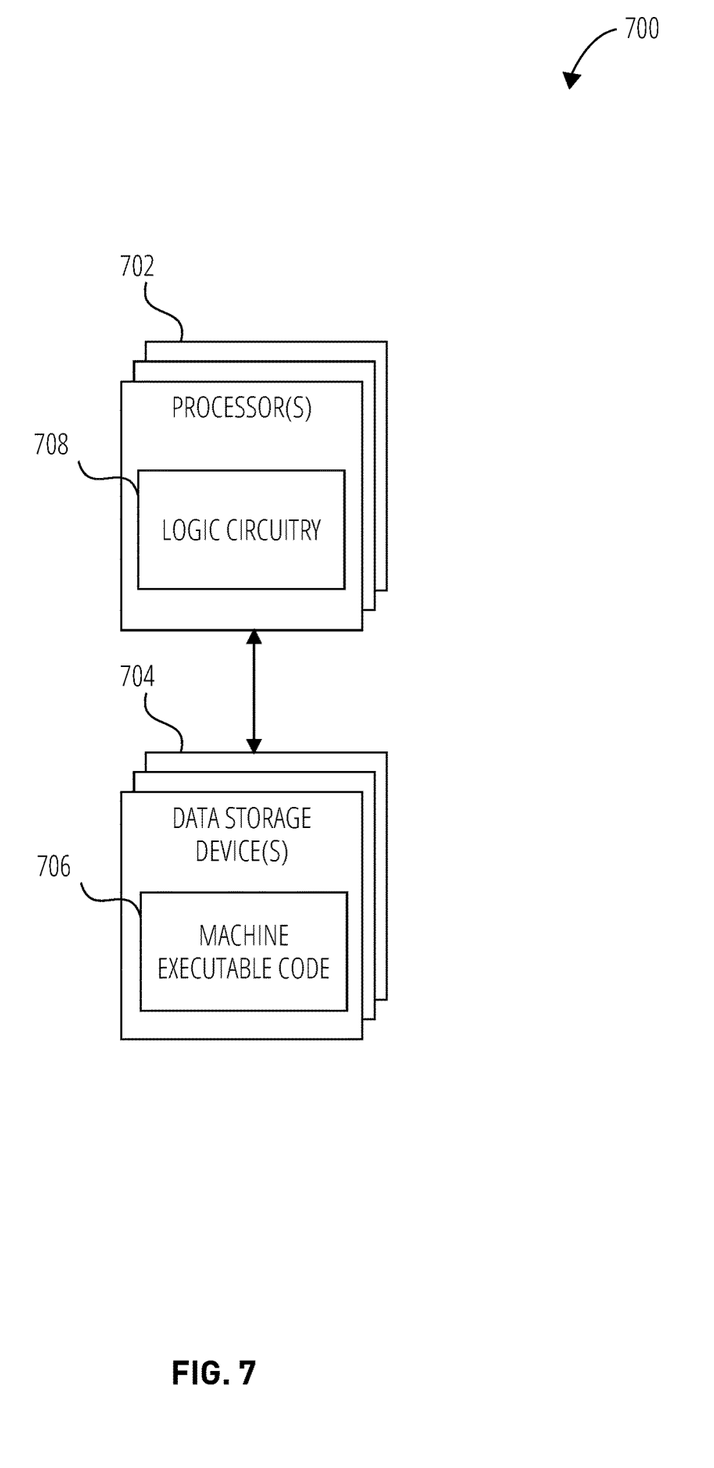
FIG. 7 is a block diagram of circuitry that, in some examples, may be used to implement various functions, operations, acts, processes, and/or methods disclosed herein.

It will be appreciated by those of ordinary skill in the art that functional elements of examples disclosed herein (e.g., functions, operations, acts, processes, and/or methods) may be implemented in any suitable hardware, software, firmware, or combinations thereof. FIG. 7 illustrates non-limiting examples of implementations of functional elements disclosed herein. In some examples, some or all portions of the functional elements disclosed herein may be performed by hardware specially configured for carrying out the functional elements.

FIG. 7 is a block diagram of circuitry 700 that, in some examples, may be used to implement various functions, operations, acts, processes, and/or methods disclosed herein. The circuitry 700 includes one or more processors 702 (sometimes referred to herein as "processors 702") operably coupled to one or more data storage devices (sometimes referred to herein as "storage 704"). The storage 704 includes machine executable code 706 stored thereon and the processors 702 include logic circuitry 708. The machine executable code 706 includes information describing functional elements that may be implemented by (e.g., performed by) the logic circuitry 708. The logic circuitry 708 is adapted to implement (e.g., perform) the functional elements described by the machine executable code 706. The circuitry 700, when executing the functional elements described by the machine executable code 706, should be considered as special purpose hardware configured for carrying out functional elements disclosed herein. In some examples the processors 702 may be configured to perform the functional elements described by the machine executable code 706 sequentially, concurrently (e.g., on one or more different hardware platforms), or in one or more parallel process streams.

When implemented by logic circuitry 708 of the processors 702, the machine executable code 706 is configured to adapt the processors 702 to perform operations of examples disclosed herein. For example, the machine executable code 706 may be configured to adapt the processors 702 to perform at least a portion or a totality of process 600 of FIG. 6. As another example, the machine executable code 706 may be configured to adapt the processors 702 to perform at least a portion or a totality of the operations discussed for apparatus 100 of FIG. 1, portion 200 of FIG. 2, portion 300 of FIG. 3, or portion 400 of FIG. 5. As another example, the machine executable code 706 may be configured to adapt the processors 702 to perform at least a portion or a totality of the operations discussed for system 500 of FIG. 5.

The processors 702 may include a general purpose processor, a special purpose processor, a central processing unit (CPU), a microcontroller, a programmable logic controller (PLC), a digital signal processor (DSP), an application specific integrated circuit (ASIC), a field-programmable gate array (FPGA) or other programmable logic device, discrete gate or transistor logic, discrete hardware components, other programmable device, or any combination thereof designed to perform the functions disclosed herein. A general-purpose computer including a processor is considered a special-purpose computer while the general-purpose computer is configured to execute functional elements corresponding to the machine executable code 706 (e.g., software code, firmware code, hardware descriptions) related to examples of the present disclosure. It is noted that a general-purpose processor (may also be referred to herein as a host processor or simply a host) may be a microprocessor, but in the alternative, the processors 702 may include any conventional processor, controller, microcontroller, or state machine. The processors 702 may also be implemented as a combination of computing devices, such as a combination of a DSP and a microprocessor, a plurality of microprocessors, one or more microprocessors in conjunction with a DSP core, or any other such configuration.

In some examples the storage 704 includes volatile data storage (e.g., random-access memory (RAM)), non-volatile data storage (e.g., Flash memory, a hard disc drive, a solid state drive, erasable programmable read-only memory (EPROM), without limitation). In some examples, the processors 702 and the storage 704 may be implemented into a single device (e.g., a semiconductor device product, a system on chip (SOC), without limitation). In some examples, the processors 702 and the storage 704 may be implemented into separate devices.

In some examples, the machine executable code 706 may include computer-readable instructions (e.g., software code, firmware code). By way of non-limiting example, the computer-readable instructions may be stored by the storage 704, accessed directly by the processors 702, and executed by the processors 702 using at least the logic circuitry 708. Also by way of non-limiting example, the computer-readable instructions may be stored on the storage 704, transferred to a memory device (not shown) for execution, and executed by the processors 702 using at least the logic circuitry 708.

Accordingly, in some examples the logic circuitry 708 includes electrically configurable logic circuitry 708.

In some examples, the machine executable code 706 may describe hardware (e.g., circuitry) to be implemented in the logic circuitry 708 to perform the functional elements. This hardware may be described at any of a variety of levels of abstraction, from low-level transistor layouts to high-level description languages. At a high-level of abstraction, a hardware description language (HDL) such as an IEEE Standard hardware description language (HDL) may be used. By way of non-limiting examples, VERILOG™, SYSTEMVERILOG™ or very large scale integration (VLSI) hardware description language (VHDL) may be used.

HDL descriptions may be converted into descriptions at any of numerous other levels of abstraction as desired. As a non-limiting example, a high-level description can be converted to a logic-level description such as a register-transfer language (RTL), a gate-level (GL) description, a layout-level description, or a mask-level description. As a non-limiting example, micro-operations to be performed by hardware logic circuits (e.g., gates, flip-flops, registers, without limitation) of the logic circuitry 708 may be described in a RTL and then converted by a synthesis tool into a GL description, and the GL description may be converted by a placement and routing tool into a layout-level description that corresponds to a physical layout of an integrated circuit of a programmable logic device, discrete gate or transistor logic, discrete hardware components, or combinations thereof. Accordingly, in some examples the machine executable code 706 may include an HDL, an RTL, a GL description, a mask level description, other hardware description, or any combination thereof.

In examples where the machine executable code 706 includes a hardware description (at any level of abstraction), a system (not shown, but including the storage 704) may be configured to implement the hardware description described by the machine executable code 706. By way of non-limiting example, the processors 702 may include a programmable logic device (e.g., an FPGA or a PLC) and the logic circuitry 708 may be electrically controlled to implement circuitry corresponding to the hardware description into the logic circuitry 708. Also by way of non-limiting example, the logic circuitry 708 may include hard-wired logic manufactured by a manufacturing system (not shown, but including the storage 704) according to the hardware description of the machine executable code 706.

Regardless of whether the machine executable code 706 includes computer-readable instructions or a hardware description, the logic circuitry 708 is adapted to perform the functional elements described by the machine executable code 706 when implementing the functional elements of the machine executable code 706. It is noted that although a hardware description may not directly describe functional elements, a hardware description indirectly describes functional elements that the hardware elements described by the hardware description are capable of performing.

Figure 8A:
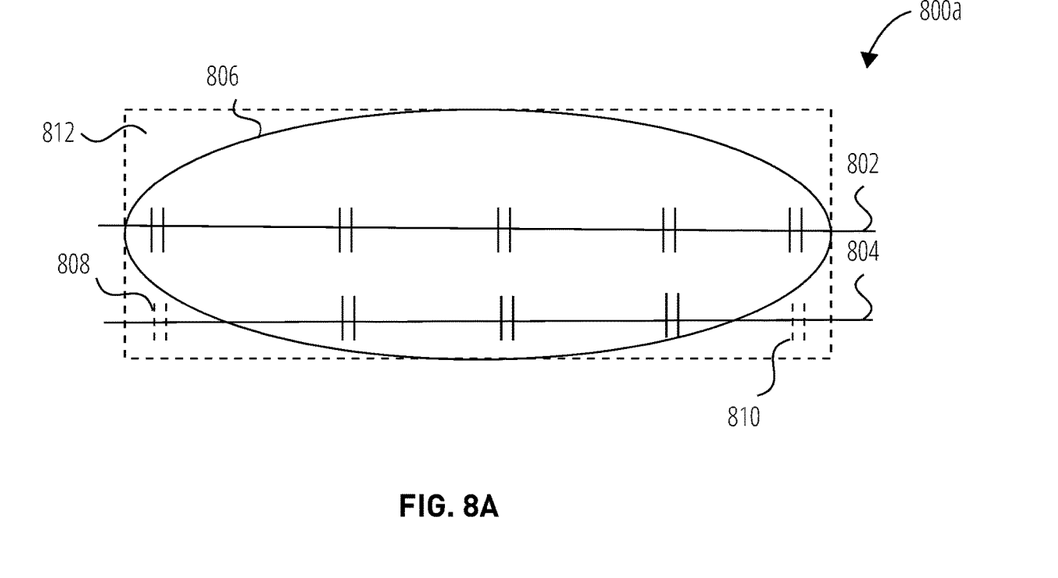
FIGS. 8A, 8B and 8C are schematic diagrams of example arrangements of sensor layouts.
Figure 8B:
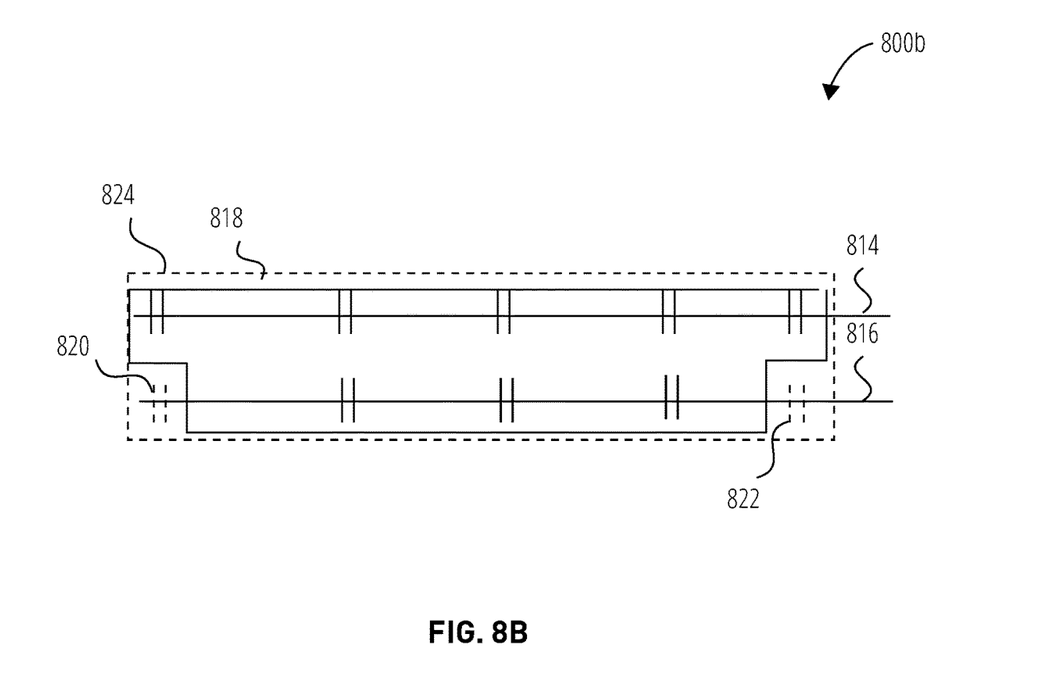
Figure 8C:
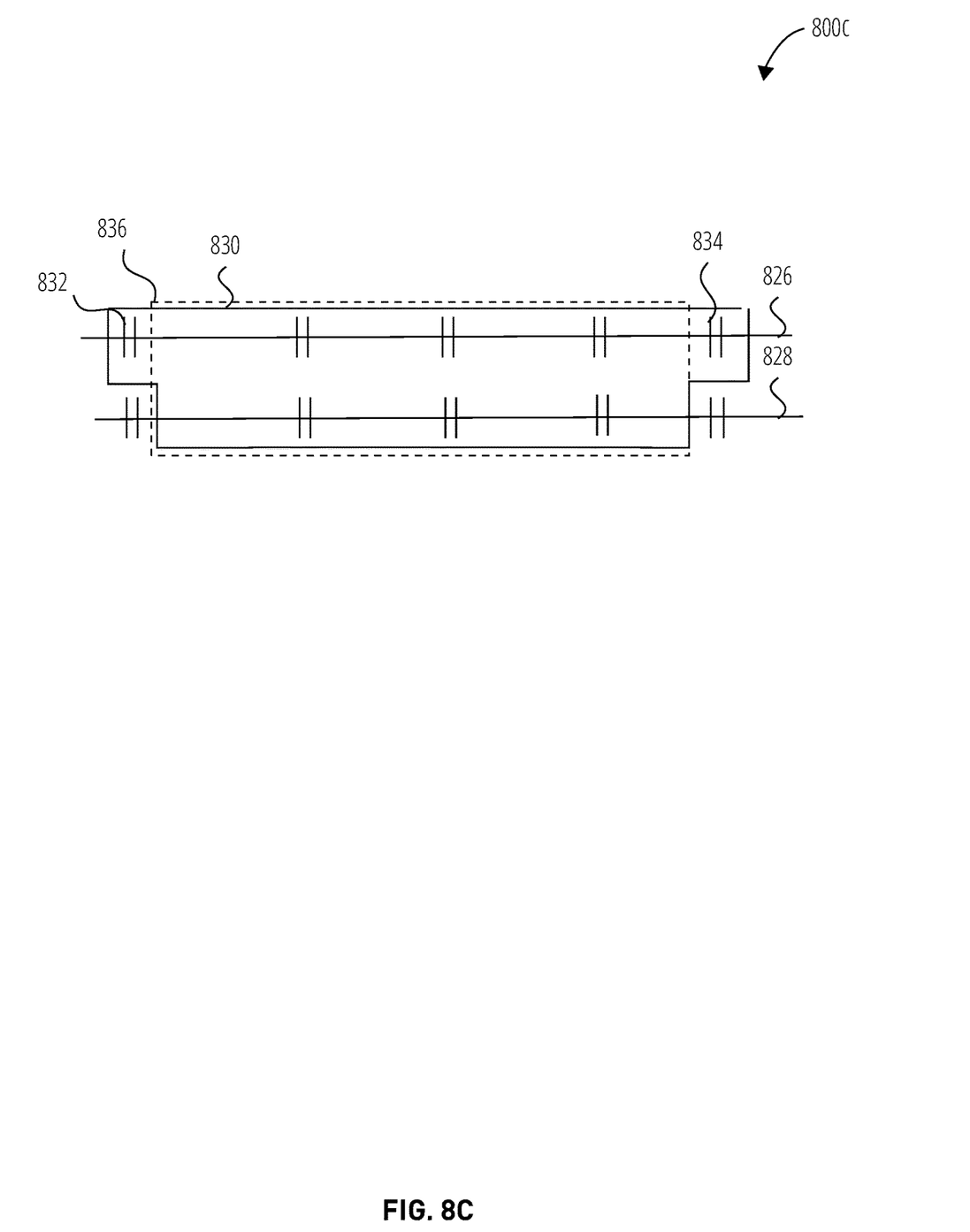

FIG. 8A, FIG. 8B and FIG. 8C illustrate non-limiting examples of non-rectangular shaped arrangements of sensor nodes in accordance with one or more examples. FIG. 8A depicts an arrangement 800a that exhibits an elliptical shape 806. First receiver electrode 802 includes a number of sensor nodes, and second receiver electrode 804 includes a number of sensor nodes that is less than the number of sensor nodes of first receiver electrode 802. Examples of missing sensor nodes 808 and 810 are depicted to show some sensor nodes that would be present in an equivalent balanced layout of sensor nodes having a rectangular shape 812. Similarly, FIG. 8B depicts an arrangement 800b that exhibits a trapezoidal shape 818. First receiver electrodes 814 includes a number of sensor nodes, and second receiver electrode 816 includes a number of sensor nodes that is less than the number of sensor nodes of first receiver electrode 814. Examples of missing sensor nodes 822 and 820 are depicted to represent some sensor nodes that would be present in an equivalent balanced layout of sensor nodes having a rectangular shape 824. FIG. 8C depicts an arrangement 800c that exhibits a trapezoidal shape 830. First receiver electrodes 826 includes a number of sensor nodes, and second receiver electrode 828 includes a number of sensor nodes that is less than the number of sensor nodes of first receiver electrode 826. In the specific non-limiting example depicted by FIG. 8C, the equivalent balanced layout exhibits a rectangular shape 836 that has an equivalent area that does not include sensor nodes 832 and 834, which are examples of "additional sensor nodes" discussed above.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, without limitation) of the computing system. In some examples, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," without limitation). As used herein, "each" means some or a totality. As used herein, "each and every" means a totality.

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, without limitation" or "one or more of A, B, and C, without limitation" is used, in general such a construction is intended to include A alone, B alone, C alone, A and B together, A and C together, B and C together, or A, B, and C together, without limitation.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additional non-limiting examples of the disclosure include: [TBD]

Example 1: An apparatus, comprising: a connector to be coupled to a receiver electrode of a sensor array; a capacitance-to-voltage converter coupled with the connector to generate a voltage signal indicative of an associated mutual capacitance of the receiver electrode; a signal balancing circuit coupled to an input path of the capacitance-to-voltage converter to add a balancing signal to an associated input signal of the receiver electrode to generate a balanced input signal, the signal balancing circuit to generate the balancing signal at least partially responsive to a setting representative of a number of sensor nodes present at the receiver electrode; and an analog-to-digital converter coupled with the capacitance-to-voltage converter to generate a digital value representative of the generated voltage signal.

Example 2: The apparatus according to Example 1, wherein the balancing signal is in-phase with the associated input signal.

Example 3: The apparatus according to Examples 1 and 2, wherein the balancing signal is out-of-phase with the associated input signal.

Example 4: The apparatus according to Examples 1 to 3, wherein the signal balancing circuit comprises: a charge injection circuit coupled to provide a charge-transfer at the input path of the capacitance-to-voltage converter to generate the balancing signal to add to the associated input signal.

Example 5: The apparatus according to Examples 1 to 4, wherein the charge injection circuit comprises: a capacitor and a voltage driver coupled to inject charge for the charge-transfer at the input path of the capacitance-to-voltage converter.

Example 6: The apparatus according to Examples 1 to 5, wherein: the voltage driver is coupled to apply a voltage to a first plate of the capacitor; and a second plate of the capacitor is coupled to inject charge of the charge-transfer at the input path of the capacitance-to-voltage converter at least partially responsive to the voltage applied to the first plate of the capacitor.

Example 7: The apparatus according to Examples 1 to 6, wherein a charge of the charge-transfer is in-phase with the associated input signal.

Example 8: The apparatus according to Examples 1 to 7, wherein a charge of the charge-transfer is out-of-phase with the associated input signal.

Example 9: The apparatus according to Examples 1 to 8, wherein the input path comprises: a current amplifier coupled to amplify the balanced input signal; and a summation block to generate a differential signal at least partially responsive to a component input signal and an adjacent component input signal, the component input signal comprising the amplified balanced input signal, wherein the capacitance-to-voltage converter to generate the voltage signal at least partially responsive to the differential signal.

Example 10: A method, comprising: receiving an associated input signal via a receiver electrode of a sensor array, the associated input signal indicative of an associated mutual capacitance of the receiver electrode; adding a balancing signal with the associated input signal to generate a balanced input signal at least partially responsive to a number of sensor nodes present at the receiver electrode; generating a voltage signal indicative of the associated mutual capacitance of the receiver electrode at least partially responsive to a balanced input signal comprising the associated input signal added with the balancing signal; and generating a digital value representative of the voltage signal.

Example 11: The method according to Example 10, comprising: providing a charge-transfer to, or from, the associated input signal to add the balancing signal to the associated input signal.

Example 12: The method according to Examples 10 and 11, comprising: determining a value representative of the associated mutual capacitance of the receiver electrode at least partially responsive to the generated digital value representative of the voltage signal.

Example 13: The method according to Examples 10 to 12, comprising: generating the balancing signal in-phase with the associated input signal.

Example 14: The method according to Examples 10 to 13, comprising: generating the balancing signal out-of-phase with the associated input signal.

Example 15: A system, comprising: a display; an arrangement of receiver and transmitter electrodes, the receiver and transmitter electrodes arranged as capacitive sensor nodes of a sensor array; a measurement circuit coupled to a receiver electrode and transmitter electrode to determine a mutual capacitance of a sensor node formed an intersection of the receiver and transmitter electrode; and at least one signal balancing circuit coupled to an input path of the measurement circuit to add a balancing signal to an associated input signal, the added balancing signal at least partially responsive to a number of sensor nodes at the receiver electrode.

Example 16: The system according to Example 15, wherein a shape exhibited by the arrangement is a non-rectangular shape.

Example 17: The system according to Example 16, wherein the non-rectangular shape is one of trapezoidal, tapered, polygonal, or elliptical.

While the present disclosure has been described herein with respect to certain illustrated examples, those of ordinary skill in the art will recognize and appreciate that the present invention is not so limited. Rather, many additions, deletions, and modifications to the illustrated and described examples may be made without departing from the scope of the invention as hereinafter claimed along with their legal equivalents. In addition, features from one example may be combined with features of another example while still being encompassed within the scope of the invention as contemplated by the inventor.

What is claimed is:

1. An apparatus, comprising:
   a connector to be coupled to a receiver electrode of a sensor array;
   a capacitance-to-voltage converter coupled with the connector to generate a voltage signal indicative of an associated mutual capacitance of the receiver electrode;
   a signal balancing circuit coupled to an input path of the capacitance-to-voltage converter to add a balancing signal to an associated input signal of the receiver electrode to generate a balanced input signal, the signal balancing circuit to generate the balancing signal at least partially responsive to a setting representative of a number of sensor nodes present at the receiver electrode; and
   an analog-to-digital converter coupled with the capacitance-to-voltage converter to generate a digital value representative of the generated voltage signal.

2. The apparatus of claim 1, wherein the balancing signal is in-phase with the associated input signal.

3. The apparatus of claim 1, wherein the balancing signal is out-of-phase with the associated input signal.

4. The apparatus of claim 1, wherein the signal balancing circuit comprises:
   a charge injection circuit coupled to provide a charge-transfer at the input path of the capacitance-to-voltage converter to generate the balancing signal to add to the associated input signal.

5. The apparatus of claim 4, wherein the charge injection circuit comprises:
   a capacitor and a voltage driver coupled to inject charge for the charge-transfer at the input path of the capacitance-to-voltage converter.

6. The apparatus of claim 5, wherein:
   the voltage driver is coupled to apply a voltage to a first plate of the capacitor; and
   a second plate of the capacitor is coupled to inject charge of the charge-transfer at the input path of the capacitance-to-voltage converter at least partially responsive to the voltage applied to the first plate of the capacitor.

7. The apparatus of claim 4, wherein a charge of the charge-transfer is in-phase with the associated input signal.

8. The apparatus of claim 4, wherein a charge of the charge-transfer is out-of-phase with the associated input signal.

9. The apparatus of claim 1, wherein the input path comprises:
   a current amplifier coupled to amplify the balanced input signal; and
   a summation block to generate a differential signal at least partially responsive to a component input signal and an adjacent component input signal, the component input signal comprising the amplified balanced input signal, wherein the capacitance-to-voltage converter to generate the voltage signal at least partially responsive to the differential signal.

10. A method, comprising:
    receiving an associated input signal via a receiver electrode of a sensor array, the associated input signal indicative of an associated mutual capacitance of the receiver electrode;
    adding a balancing signal with the associated input signal to generate a balanced input signal at least partially responsive to a number of sensor nodes present at the receiver electrode;
    generating a voltage signal indicative of the associated mutual capacitance of the receiver electrode at least partially responsive to a balanced input signal comprising the associated input signal added with the balancing signal; and
    generating a digital value representative of the voltage signal.

11. The method of claim 10, comprising:
    providing a charge-transfer to, or from, the associated input signal to add the balancing signal to the associated input signal.

12. The method of claim 10, comprising:
    determining a value representative of the associated mutual capacitance of the receiver electrode at least partially responsive to the generated digital value representative of the voltage signal.

13. The method of claim 10, comprising:
    generating the balancing signal in-phase with the associated input signal.

14. The method of claim 10, comprising:
    generating the balancing signal out-of-phase with the associated input signal.

15. A system, comprising:
    a display;
    an arrangement of receiver and transmitter electrodes, the receiver and transmitter electrodes arranged as capacitive sensor nodes of a sensor array;
    a measurement circuit coupled to a receiver electrode and transmitter electrode to determine a mutual capacitance of a sensor node formed an intersection of the receiver and transmitter electrode; and
    at least one signal balancing circuit coupled to an input path of the measurement circuit to add a balancing signal to an associated input signal, the added balancing signal at least partially responsive to a number of sensor nodes at the receiver electrode.

16. The system of claim 15, wherein a shape exhibited by the arrangement is a non-rectangular shape.

17. The system of claim 16, wherein the non-rectangular shape is one of trapezoidal, tapered, polygonal, or elliptical.

* * * * *